(12) United States Patent
Doyle et al.

(10) Patent No.: US 7,407,847 B2
(45) Date of Patent: Aug. 5, 2008

(54) STACKED MULTI-GATE TRANSISTOR DESIGN AND METHOD OF FABRICATION

(75) Inventors: Brian S Doyle, Portland, OR (US);
Titash Rakshit, Hillsboro, OR (US);
Robert S Chau, Beaverton, OR (US);
Suman Datta, Beaverton, OR (US);
Justin K Brask, Portland, OR (US);
Uday Shah, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 140 days.

(21) Appl. No.: 11/395,860

(22) Filed: Mar. 31, 2006

(65) Prior Publication Data

US 2007/0231997 A1 Oct. 4, 2007

(51) Int. Cl.
*H01L 21/84* (2006.01)

(52) U.S. Cl. ....................................... 438/164

(58) Field of Classification Search ................. 438/164, 438/218, 294, 514; 257/347–354, 213, 288
See application file for complete search history.

(56) References Cited

U.S. PATENT DOCUMENTS

| | | | |
|---|---|---|---|
| 5,804,848 A | 9/1998 | Mukai | |
| 5,844,278 A | 12/1998 | Mizuno et al. | |
| 5,899,710 A | 5/1999 | Mukai | |
| 5,963,789 A * | 10/1999 | Tsuchiaki | 438/62 |
| 6,018,176 A | 1/2000 | Lim | |
| 6,066,869 A | 5/2000 | Noble et al. | |
| 6,413,802 B1 | 7/2002 | Hu et al. | |
| 6,459,123 B1 | 10/2002 | Enders et al. | |
| 6,472,258 B1 | 10/2002 | Adkisson et al. | |
| 6,525,403 B2 | 2/2003 | Inaba et al. | |
| 6,562,665 B1 | 5/2003 | Yu | |
| 6,583,469 B1 | 6/2003 | Fried et al. | |
| 6,611,029 B1 | 8/2003 | Ahmed et al. | |
| 6,630,388 B2 | 10/2003 | Sekigawa et al. | |
| 6,635,909 B2 | 10/2003 | Clark et al. | |
| 6,642,090 B1 * | 11/2003 | Fried et al. | 438/164 |
| 6,657,259 B2 | 12/2003 | Fried et al. | |
| 6,689,650 B2 | 2/2004 | Gambino et al. | |
| 6,770,516 B2 | 8/2004 | Wu et al. | |
| 6,787,402 B1 | 9/2004 | Yu | |

(Continued)

OTHER PUBLICATIONS

Hwang et al., "On the origin of the notching effect during etching in uniform high density plasmas," J. Vac. Sci. Technol. B 15(), Jan./Feb. 1997, pp. 70-87.

(Continued)

*Primary Examiner*—Calvin Lee
(74) *Attorney, Agent, or Firm*—Blakely, Sokoloff, Taylor & Zafman LLP

(57) ABSTRACT

A multi-body thickness (MBT) field effect transistor (FET) comprises a silicon body formed on a substrate. The silicon body may comprise a wide section and a narrow section between the wide section and the substrate. The silicon body may comprise more than one pair of a wide section and a narrow section, each pair being located at a different height of the silicon body. The silicon body is surrounded by a gate material on three sides. The substrate may be a bulk silicon substrate or a silicon-on-insulator (SOI) substrate. The MBT-FET combines the advantages of a wide fin device and a narrow fin device.

19 Claims, 12 Drawing Sheets

U.S. PATENT DOCUMENTS

| | | |
|---|---|---|
| 6,787,854 B1 * | 9/2004 | Yang et al. .................. 257/348 |
| 6,794,718 B2 | 9/2004 | Nowak et al. |
| 6,798,000 B2 | 9/2004 | Luyken et al. |
| 6,800,910 B2 | 10/2004 | Lin et al. |
| 6,803,631 B2 | 10/2004 | Dakshina-Murthy et al. |
| 6,812,075 B2 | 11/2004 | Fried et al. |
| 6,815,277 B2 | 11/2004 | Fried et al. |
| 6,821,834 B2 | 11/2004 | Ando |
| 6,833,588 B2 | 12/2004 | Yu et al. |
| 6,835,614 B2 | 12/2004 | Hanafi et al. |
| 6,849,884 B2 | 2/2005 | Clark et al. |
| 6,869,868 B2 | 3/2005 | Chiu et al. |
| 6,885,055 B2 | 4/2005 | Lee |
| 6,893,927 B1 | 5/2005 | Shah et al. |
| 6,897,527 B2 | 5/2005 | Dakshina-Murthy et al. |

OTHER PUBLICATIONS

Yang-Kyu Choi, et al., "Sub-20nm CMOS FinFET Technologies", 2001 IEEE, 0-7803-7050-3/01 (pp. 19.1.1-19.1.4).

Jong-Tae Park, et al., "Pi-Gate SOI MOSFET", IEEE Electron Device Letters, vol. 22, No. 8, Aug. 2001, 0741-3106/01 (pp. 405-406).

* cited by examiner

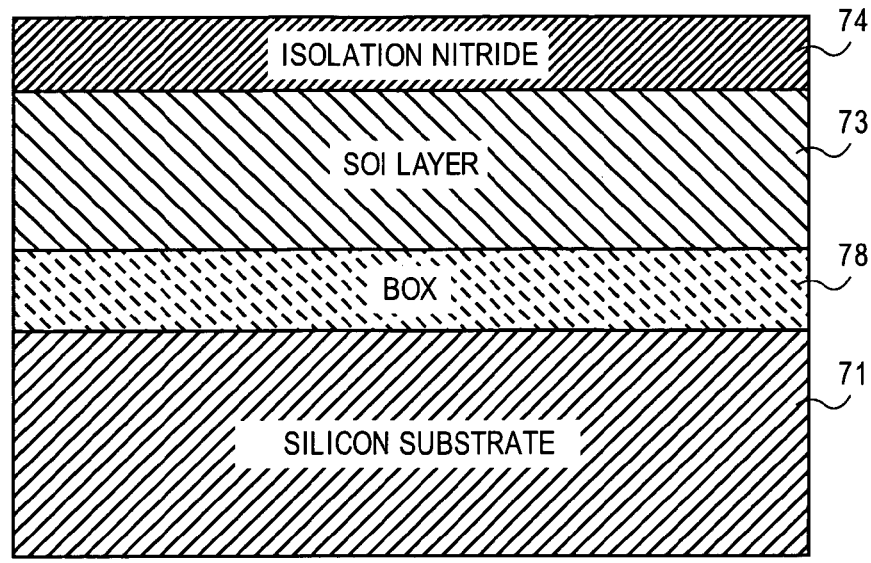
FIG. 7A
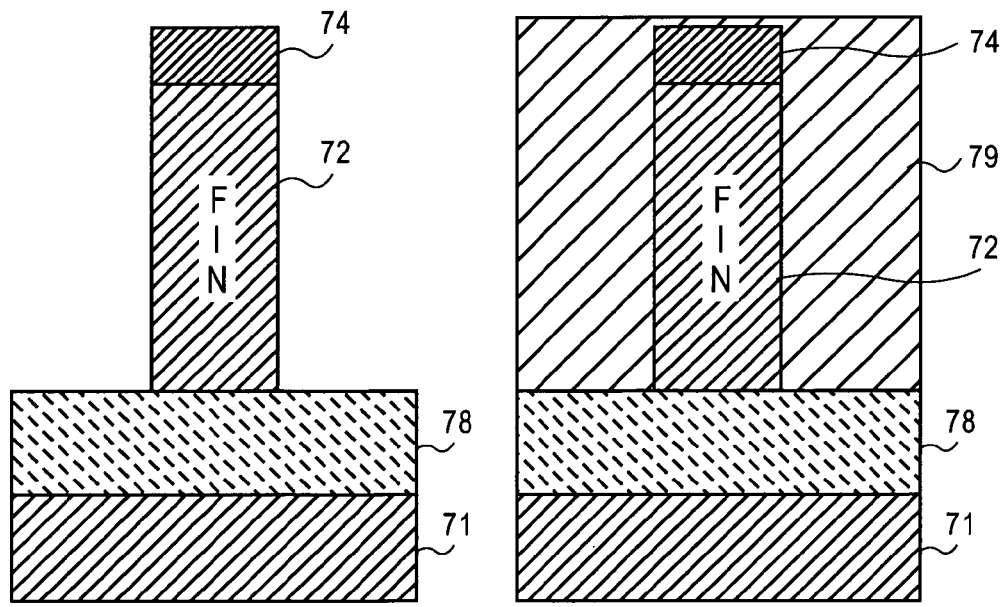
FIG. 7B  FIG. 7C

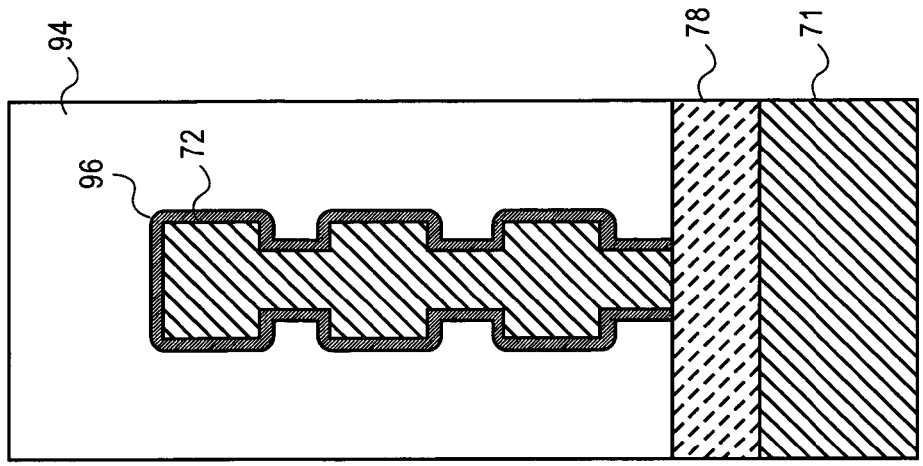
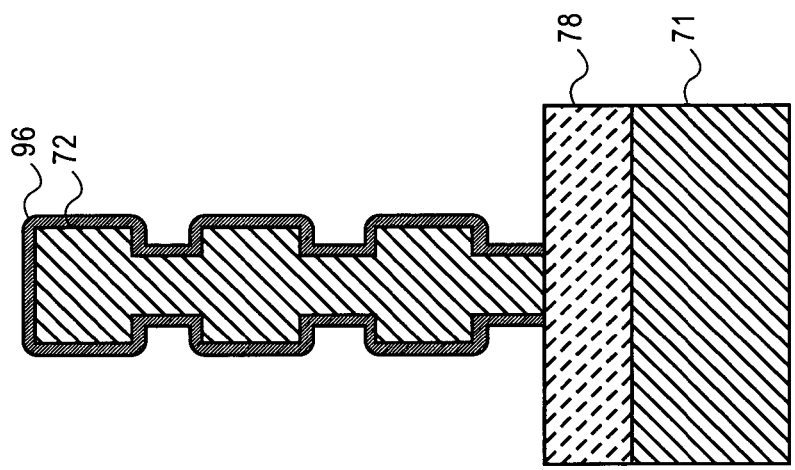
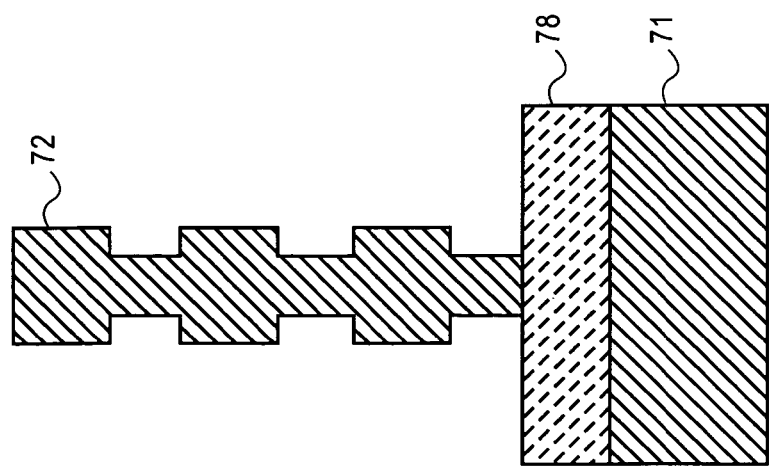
FIG. 9C
FIG. 9B
FIG. 9A

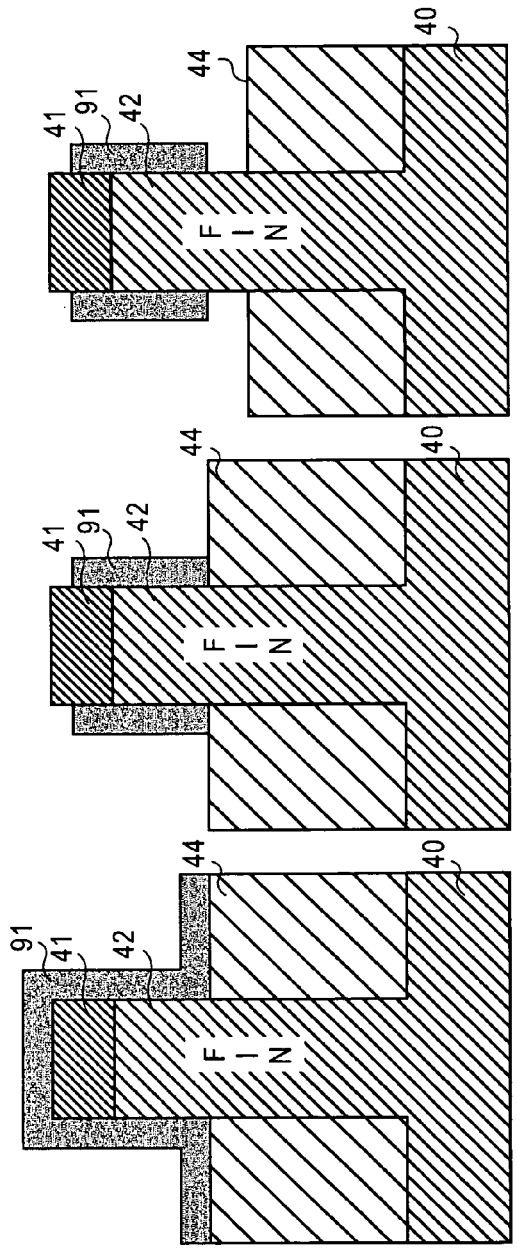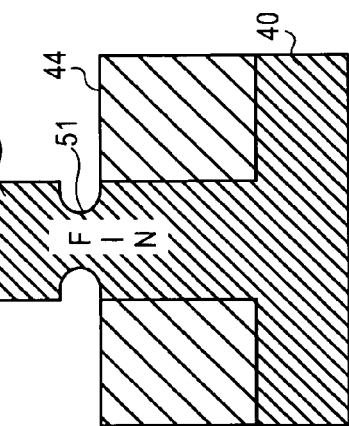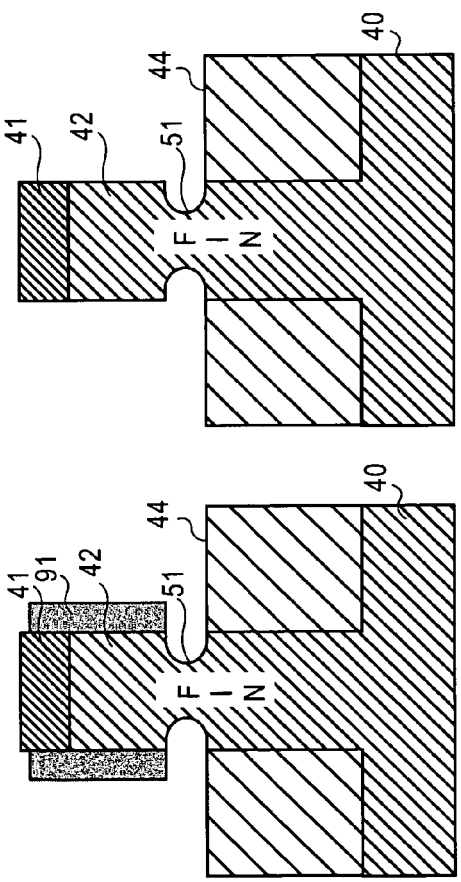

STACKED MULTI-GATE TRANSISTOR DESIGN AND METHOD OF FABRICATION

BACKGROUND

1. Field

Semiconductor integrated circuit fabrication.

2. Background

A recent development in semiconductor processing is the tri-gate transistor. A tri-gate transistor includes a thin semiconductor body (e.g., a silicon fin) formed on a substrate. A gate dielectric is formed on the top surface and the sidewalls of the fin. A gate electrode is formed on the surface of the gate dielectric on the top surface and the sidewalls of the fin. Source and drain regions are formed in the fin on opposite sides of the gate electrode. Because the gate electrode and the gate dielectric surround the semiconductor body on three sides, the transistor essentially has three separate gates. These three separate gates provide three separate channels for electrical signals to travel, thus effectively tripling the conductivity as compared to a conventional planar transistor.

Tri-gate transistors generally have superior performance to bulk gate devices. This is because of the proximity of the top and side gates to each other, which, as the fin thins, causes full depletion and results in steeper sub-threshold gradients (SG) and smaller drain induced barrier lowering (DIBL). The term "thin" hereinafter is used interchangeably with the term "narrow" to describe the dimension between the opposite sidewalls of the fin.

The SG and DIBL typically are used to determine short-channel effects (SCEs) in a transistor. In general, it is desired that SCEs are low such that the transistor off-state leakage current, Ioff (i.e., a current flowing between source and drain regions when a transistor is in an off state), remains as low as possible. A steeper SG and/or reduced DIBL indicates lower Ioff, and thus smaller and better SCEs.

Generally, the thinner the fin the smaller and better the SCEs. However, thinner fins suffer from large external resistance (Rext), which causes reduced drive current. The reduction in drive current may be measured by a change in Idsat, which is the saturated current flowing through the drain. FIG. 1A shows the DIBL of a 20 nanometer (nm)-wide fin structure (narrow fin) normalized with respect to the DIBL of a 35 nm-wide fin structure (wide fin). Both of the fins have a gate length (Lg) of 40 nm. It can be seen that the DIBL decreases substantially as the fin thins, indicating an improvement in the SCEs. However, at the same time, the thinner fin suffers greater Rext. In the example shown in FIG. 1B, the Idsat of the narrow fin is reduced by approximately 50%, which approximately matches the amount of improvement in the SCEs as seen in FIG. 1A.

BRIEF DESCRIPTION OF THE DRAWINGS

Embodiments are illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

FIG. 7A is a cross-sectional view of an isolation nitride layer and a silicon-on-insulator (SOI) layer on a SOI substrate.

FIG. 7B illustrates forming a silicon fin on the SOI substrate.

FIG. 7C illustrates covering the silicon fin with isolation oxide.

FIG. 9A illustrates removing the isolation oxide layer.

FIG. 9B illustrates forming a Hi-K dielectric layer over the silicon fin.

FIG. 9C illustrates deposition of polysilicon over the Hi-K dielectric layer to form a MBT-FET on the SOI substrate.

FIGS. 11A-E illustrate a process of notching the silicon fin to form a first narrow section.

DETAILED DESCRIPTION

Figure 2:
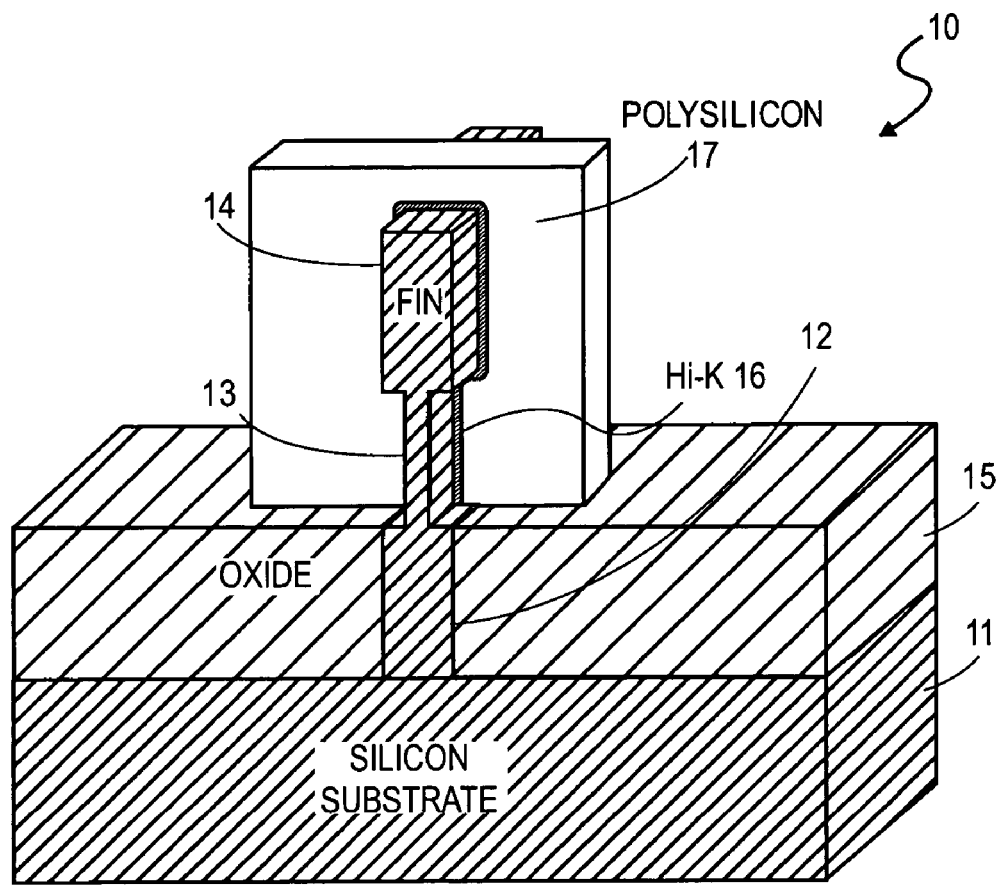
FIG. 2 shows an embodiment of a multi-body-thickness (MBT) field effect transistor (FET) having a narrow section below a wide section.

In the embodiment shown in FIG. 2, a multi-body-thickness (MBT) field-effect-transistor (FET) 10 is fabricated on a bulk silicon substrate 11. MTB transistor 10 comprises substrate 11 connecting to a silicon fin (or, interchangeably, a silicon body) vertically-oriented with respect to the top surface of substrate 11 as viewed. Relative to the orientation shown in FIG. 2, the silicon fin includes a buried section 12 in an isolation oxide layer 15, a narrow section (neck) 13 above isolation oxide layer 15, and a wide section (head) 14 on top of neck 13. A layer of high dielectric constant (Hi-K) dielectric 16 forms a blanket deposition over the surface of neck 13 and head 14. Hi-K dielectric 16 covers the sidewalls of neck 13 and head 14, the top surface of the head, and the bottom surface of the head exposed from the receding sidewalls of the neck. A gate material, e.g., polysilicon 17, is deposited over the surface of Hi-K dielectric 16 to form a gate electrode on all three sides (top, left, and right) of the silicon fin.

A MBT-FET similar to the one shown in FIG. 2 may be fabricated on a SOI substrate, as will be described later. The discussion below, however, applies equally to a MBT-FET fabricated on a bulk silicon or on a SOI substrate. Moreover, although head 14 and neck 13 in FIG. 2 are shown as having a rectangular shape, it is understood that the head and the neck may have any shape as long as the width of the head is wider than the width of the neck. The term "width" hereinafter refers to the widest dimension between the opposite sidewalls of the fin measured on a plane parallel to the top surface of substrate 11.

MBT-FET 10 combines the advantages of a wide fin device and a narrow fin device. Simulation results show that MBT-FET 10 not only has the Idsat similar to a wider fin, but also has the DIBL of a narrower fin. Thus, MBT-FET 10 has improved SCEs and better performance as compared to a transistor having a uniform fin width.

The performance of MBT-FET 10 approaches an idealized Gate-All-Around (GAA) device, in which a gate electrode is formed around all four sides of the fin. Thus, an idealized GAA device effectively has four separate gates on the top, bottom, and both sidewalls of the fin. Gate control of the GAA device may be generally better than a double-gate device or a tri-gate device. To some extent, head 14 of MBT-FET 10 resembles a GAA device. Head 14 is surrounded by polysilicon 17 deposited over both sidewalls, the top surface, and the bottom surface exposed from the receding sidewalls of neck 13. The part of the bottom surface where polysilicon 17 is deposited may serves as a bottom gate of head 14. Thus, gate control MBT-FET 10 is also generally better than a double-gate or tri-gate device having a uniform fin width.

Figure 1A:
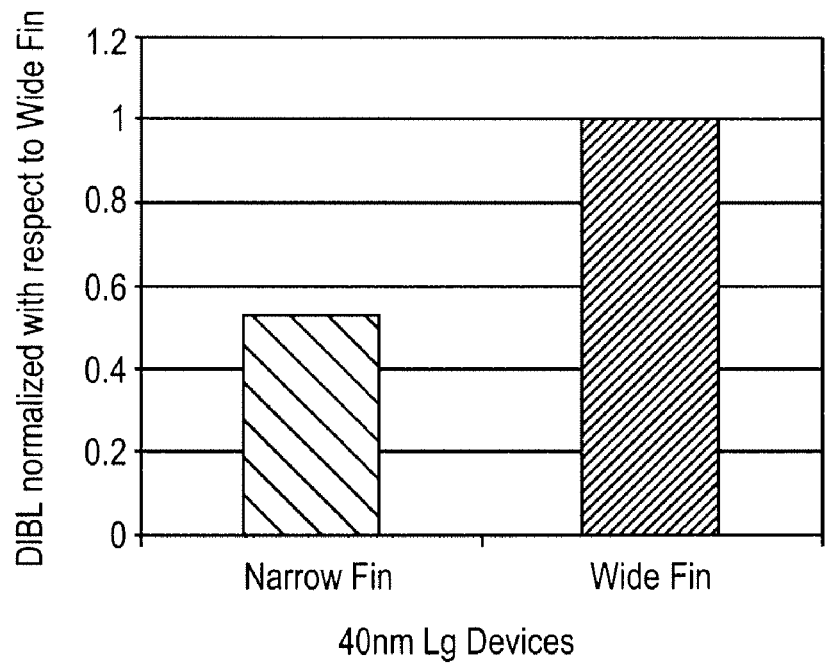
FIG. 1A is a diagram showing the effect on the DIBL when narrowing the fin of a transistor.
Figure 1B:
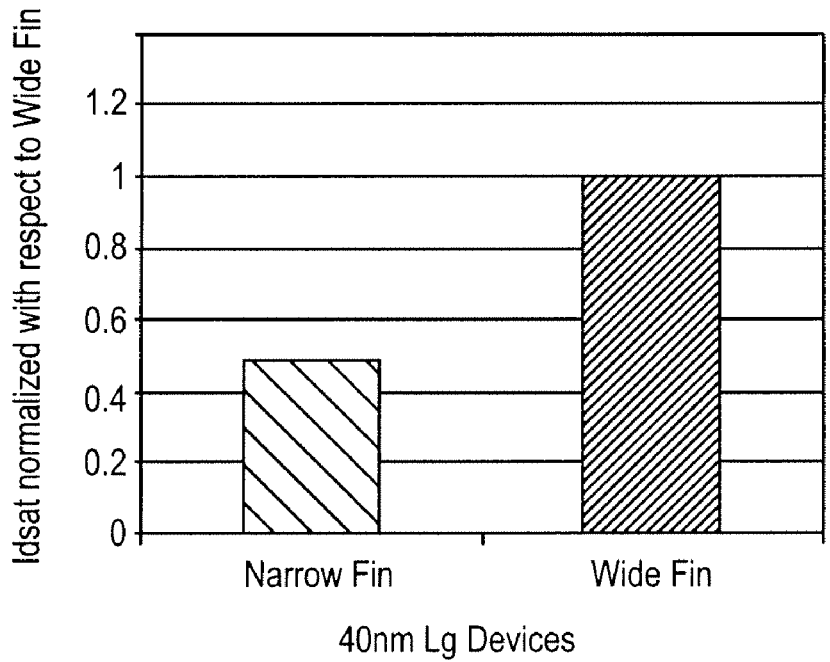
FIG. 1B is a diagram showing the effect on the Idsat when narrowing the fin of a transistor.

Moreover, the Rext of MBT-FET 10 is reduced when compared to a thin double gate or tri-gate device having a fin width as wide as neck 13. The improvement may be attributed to the wide top section of MBT-FET 10. In some embodiments, neck 13 of MBT-FET 10 is kept as short as possible with respect to the length (the vertical dimension as viewed in FIG. 2). Although a thin neck has good SCEs due to its small width, a thin neck suffers from a high Rext and thus a low Idsat as shown in FIG. 1B. Thus, typically, the head-to-neck ratio (lengthwise) of MBT-FET 10 is to be kept as large as possible without degrading the SCEs. In one embodiment, the ratio of head length to neck length is 2:1.

Figure 3:
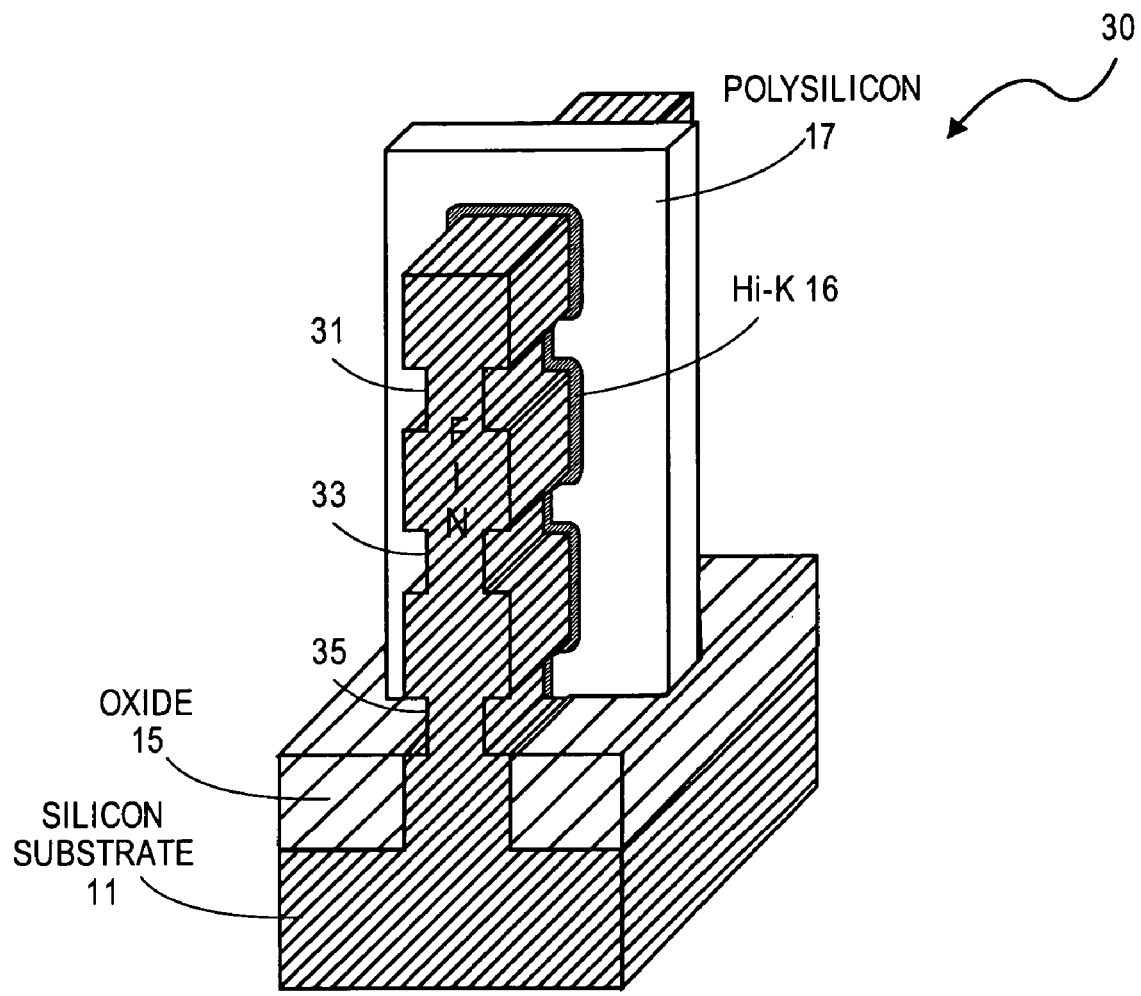
FIG. 3 shows an embodiment of a MBT-FET having multiple narrow sections.

Referring to FIG. 3, in some embodiments, a MBT-FET 30 may be fabricated to have a tall fin with more than one neck, each neck located at a different height of the fin. The multiple-neck structure may provide the drive current of several MBT-FETs 10 to drive a large load. Although only three necks (31, 33, and 35) are shown, it is understood that any number of the necks may be formed to provide a desired drive current.

Figure 4A:
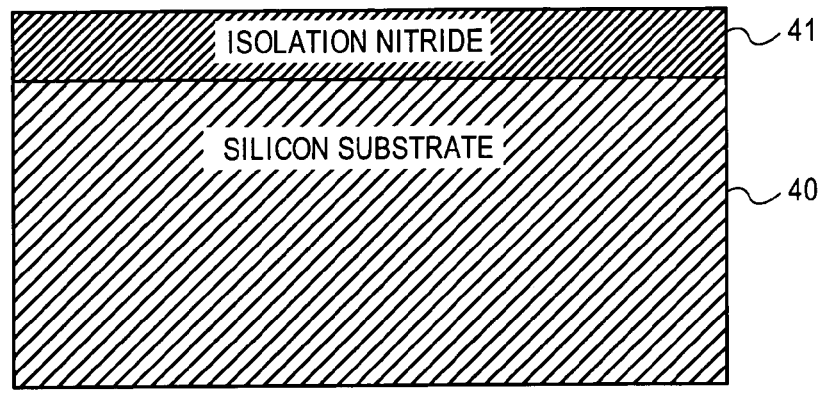
FIG. 4A is a cross-sectional view of an isolation nitride layer on a bulk silicon substrate.
Figure 4B:
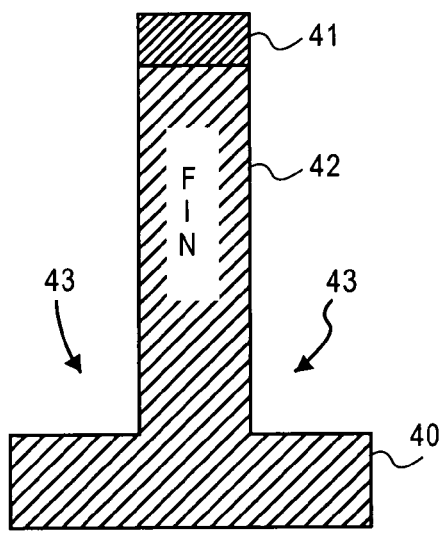
FIG. 4B illustrates forming a silicon fin on the bulk silicon substrate.
Figure 4C:
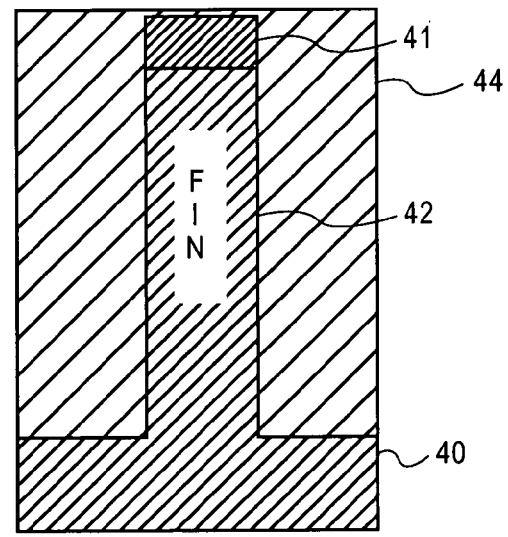
FIG. 4C illustrates covering the silicon fin with isolation oxide.

A method for forming MBT-FET 30 is described as follows. Referring to FIG. 4A, in one embodiment, a layer of isolation nitride 41 (e.g., $Si_3N_4$) is deposited on a silicon wafer, which is shown in the cross-sectional view of FIG. 4A as a silicon substrate 40. Isolation nitride 41 may serve as an insulative layer in the subsequent process of forming the heads and necks of MBT-FET 30. Referring to FIG. 4B, substrate 40 and isolation nitride 41 may be patterned by standard lithography and etching to define a fin 42. For example, a photoresist pattern may be placed on top of isolation nitride 41 to define the areas to be removed. After exposing the photoresist to ultraviolet light, a series of etching process may be performed to remove the exposed areas of isolation nitride 41 and silicon substrate 40. The photoresist may then be stripped off by an ashing process. As a result, in FIG. 4B, a trench 43 is formed on either side of remaining silicon fin 42. The remaining area of isolation nitride 41, after the patterning, defines the width of the heads to be formed. In FIG. 4C, isolation oxide 44 is deposited into trenches 43 to fill the trenches until the top surface of isolation nitride 41 is covered. Isolation oxide 44 is then planarized to the top of isolation nitride 41.

Figure 5A:
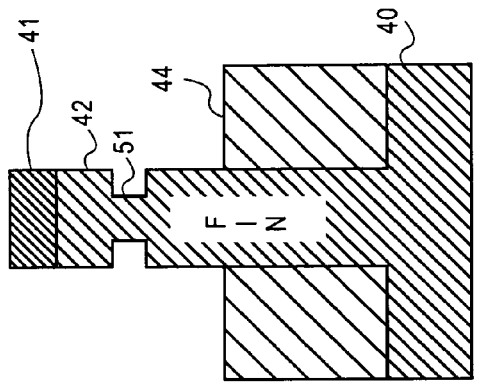
FIG. 5A illustrates removing a first layer of the isolation oxide.
Figure 5B:
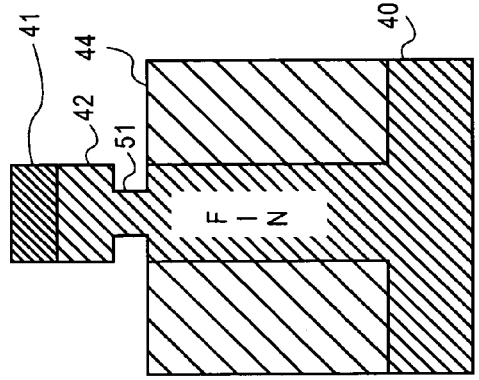
FIG. 5B illustrates forming a first narrow section of the silicon fin.

FIGS. 5A-5F illustrate a series of processes for fabricating a MBT-FET, such as MBT-FET 30 of FIG. 3. In FIG. 5A, isolation oxide 44 is wet-etched down to a pre-determined point, e.g., 200 Å below its original level, to expose a portion of fin 42. In FIG. 5B, the bottom portion exposed fin 42 is etched to notch both of the opposite sidewalls. The notched sidewalls are aggressively over-etched to form a first neck 51.

An over-etching process is described below with reference to FIG. 11. Referring to FIG. 11A, a blanket layer of an ultra thin spacer 91 is deposited over isolation oxide 44, fin 42, and isolation nitride 41. Spacer 91 may comprise any material that may protect fin 42 when isolation oxide 44 is etched, and may be removed afterwards without damaging fin 42 or isolation nitride 41. Example materials may include silicon nitride and carbon-doped silicon nitride. In one embodiment, spacer 91 may comprise a material that may be selectively etched to isolation nitride 41. In FIG. 11B, spacer 91 is etched to expose the top surface of isolation nitride 41 and isolation oxide 44. Etching of spacer 91 is controlled such that sufficient spacer 91 remains to protect the interface between isolation nitride 41 and fin 42. In FIG. 11C, isolation oxide 44 is recessed by wet etch selective to spacer 91 and isolation nitride 41. In FIG. 11D, the sidewalls of fin 42 are notched on both sides by dry or wet etch to form first neck 51. Finally, in FIG. 11E, remaining spacer 91 on the sidewalls are removed. It is to be noted that during the above over-etching process, isolation nitride 41 protects fin 42 and cannot be eroded from the top.

In an alternative embodiment of the over-etching process, the sidewalls of fin 42 may be weakly oxidized. Then the structure may be subject to an HBr/Cl/O2/Ar or a Cl/O2/Ar recipe in an ECR (Electron Cyclotron Resonance Frequency) etcher operating at density of $10^{12}$ particles/m$^3$. At this point since the entire silicon column (fin 42) is protected by an extremely thin (atomic monolayers) layer of chemical oxide, the silicon etch which is in general extremely selective to the oxide will not attack the oxide. At the same time, the bottom isolation oxide 44 accumulates positive charge because it acts as an insulator. Thus, the positively-charged isolation oxide 44 serves to deflect the positive plasma species towards the sidewalls of fin 42 at the base, causing the fin base to notch. The dimensions of the notch is a main factor in determining the etch time. However, excessive etch time is to be avoided because the plasma species may damage the sidewall protective layer above the region where the notch is to be formed.

Figure 5C:
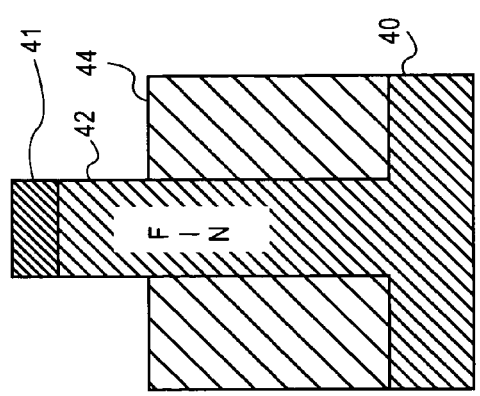
FIG. 5C illustrates removing a second layer of the isolation oxide.
Figure 5D:
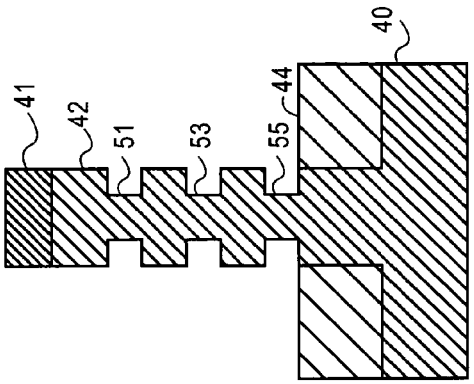
FIG. 5D illustrates forming a second narrow section of the silicon fin.
Figure 5E:
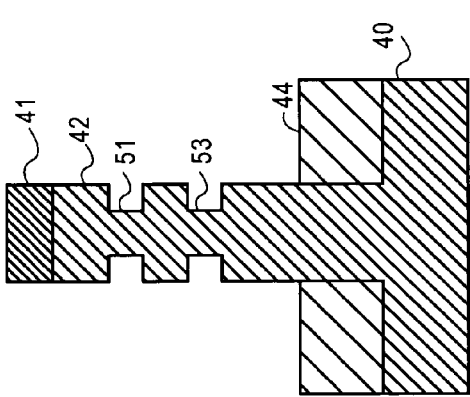
FIG. 5E illustrates removing a third layer of the isolation oxide.
Figure 5F:
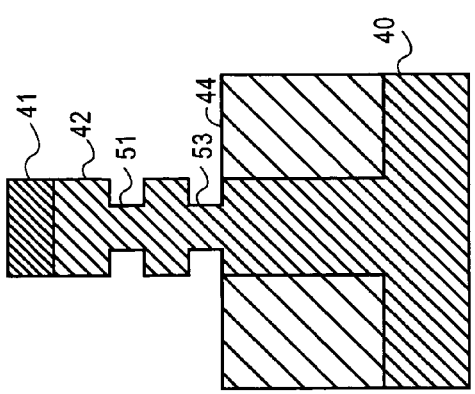
FIG. 5F illustrates forming a third narrow section of the silicon fin.

The processes of FIG. 5A and FIG. 5B may be repeated to form multiple necks 51, 53, and 55 in fin 42. In FIG. 5C, isolation oxide 44 is further wet-etched down to another level, e.g., by 200 Å, and then over-etch in FIG. 5D to form neck 53.

The wet-etch and dry-etch process shown in FIGS. 5A-5F may be repeated as many times as needed to produce a desired number of necks, as long as fin 42 has sufficient length to accommodate all of the necks.

Figure 6A:
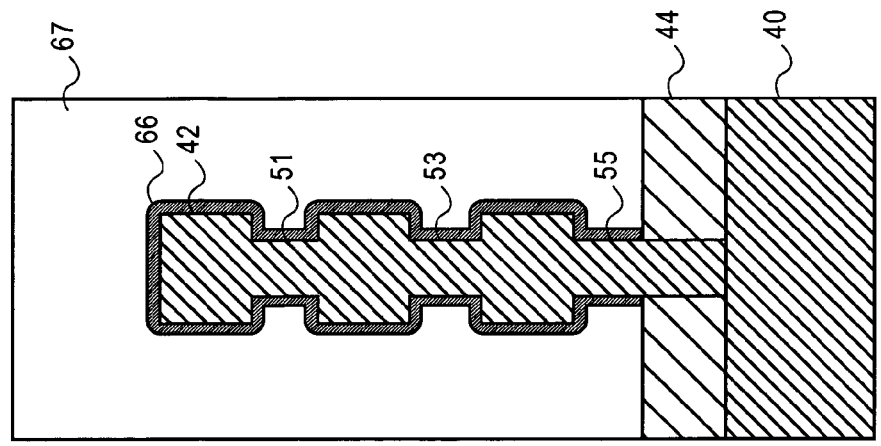
FIG. 6A illustrates removing the isolation oxide layer.
Figure 6B:
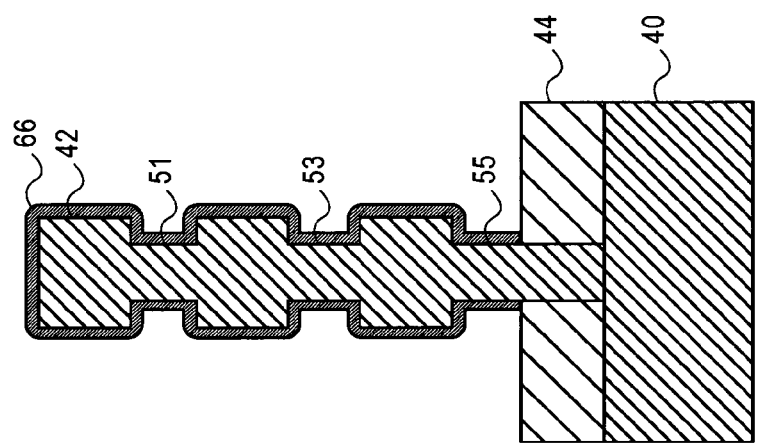
FIG. 6B illustrates forming a Hi-K dielectric layer over the silicon fin.
Figure 6C:
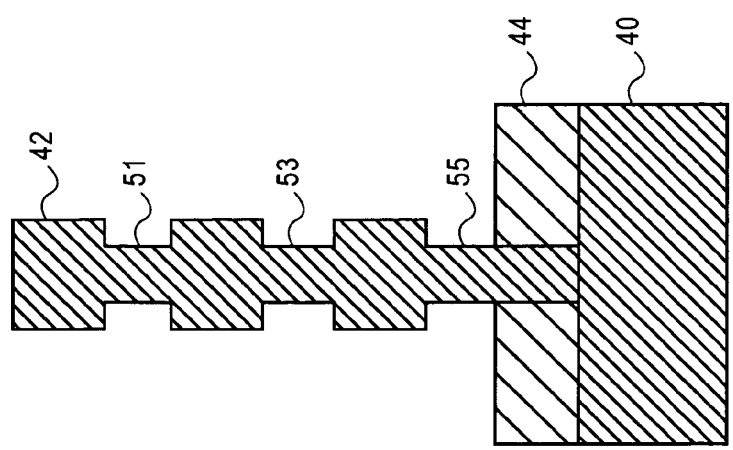
FIG. 6C illustrates deposition of polysilicon over the Hi-K dielectric layer to form a MBT-FET on the bulk silicon.
Figure 8C:
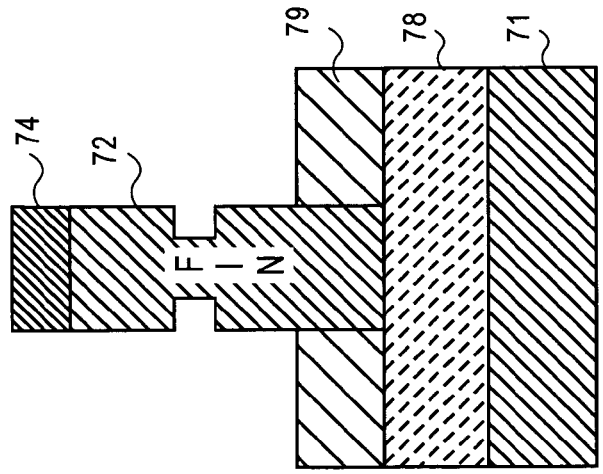
FIG. 8C illustrates removing a second layer of the isolation oxide.
Figure 8B:
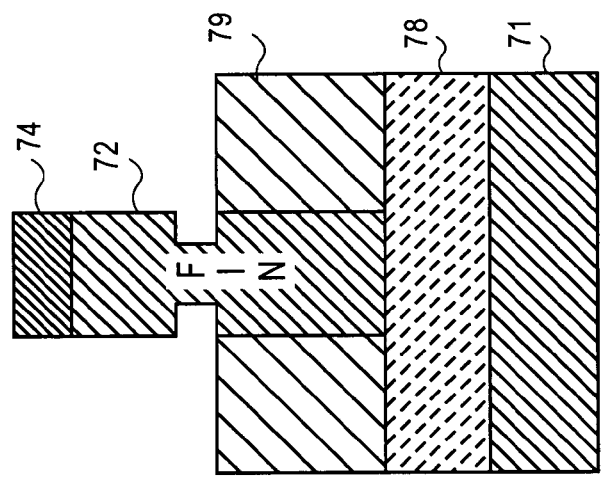
FIG. 8B illustrates forming a first narrow section of the silicon fin.
Figure 8A:
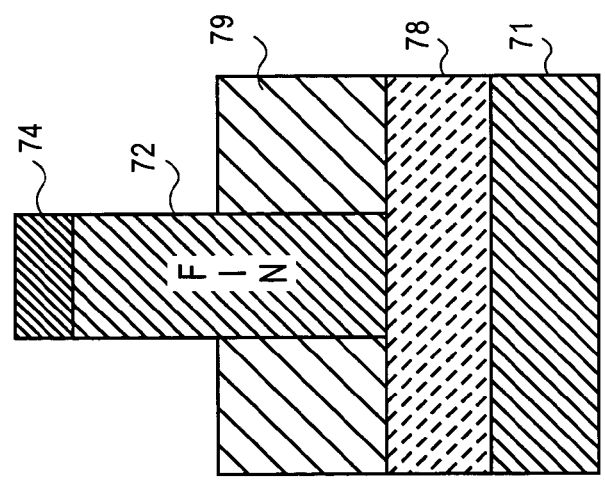
FIG. 8A illustrates removing a first layer of the isolation oxide.
Figure 8F:
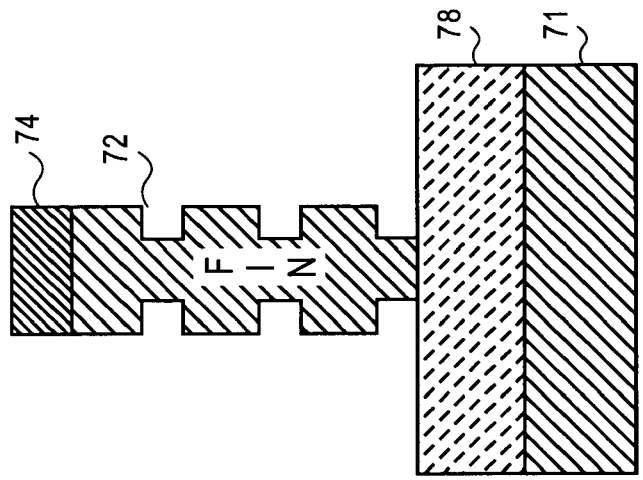
FIG. 8F illustrates forming a third narrow section of the silicon fin.
Figure 8E:
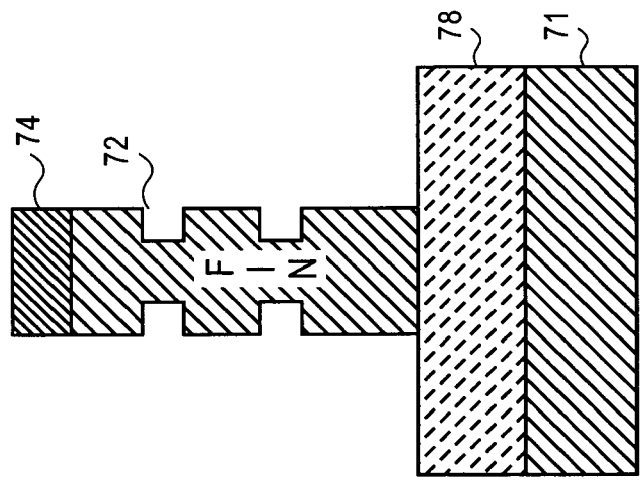
FIG. 8E illustrates removing a third layer of the isolation oxide.
Figure 8D:
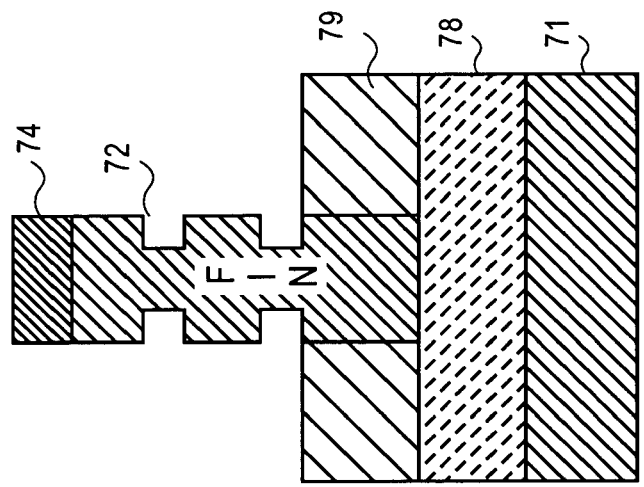
FIG. 8D illustrates forming a second narrow section of the silicon fin.

Finally, referring to FIG. 6A, isolation nitride 74 on fin 72 may be removed. In FIG. 6B, a Hi-K dielectric layer 66 is deposited over the entire exposed surface of fin 42. In FIG. 6C, polysilicon 67 is deposited over Hi-K dielectric layer 66 to form a gate electrode on the top and both sidewalls of fin 42. Polysilicon 67 is usually doped above $1E20/cm^3$. In one embodiment, an additional thin conformal metal layer (not shown) is deposited between Hi-K dielectric layer 66 and doped polysilicon 67. The thin metal layer may be used set the work function of the device. In an alternative embodiment, polysilicon 67 may be replaced by a metal layer to form a metal gate.

In an alternative embodiment, the MBT-FET may be formed on a silicon-on-isolator (SOI) substrate. The technique of forming a SOI substrate is well-known in the art. Referring to the cross-sectional view of FIG. 7A, in some embodiments, an SOI substrate may include a buried oxide layer (BOX) 78 formed on top of a silicon substrate 71. BOX 78 may be a subsurface layer of silicon dioxide (SiO2) created through ion implantation of high dose of oxygen into silicon substrate 71. An SOI layer 73 of silicon may be formed on BOX 78. A layer of isolation nitride 74 (e.g., $Si_3N_4$) may cover the top surface of SOI layer 73.

In one embodiment, referring to FIG. 7B and FIG. 7C, the process of forming a fin 72 surrounded by an isolation oxide 79 is similar to the process described in FIG. 4B and FIG. 4C. However, unlike fin 42, fin 72 is separated from silicon substrate 71 by BOX 78. Also, isolation oxide 79 is completely removed in the subsequent process. The process of forming one or more necks in fin 72, as shown in FIGS. 8A-8F, is similar to the process described in FIGS. 5A-5F and FIG. 11A-11E.

Finally, referring to FIG. 9A, isolation nitride 74 may be removed. In FIG. 9B, a Hi-K dielectric layer 96 is deposited over the entire exposed surface of fin 72. In FIG. 9C, polysilicon 94 is deposited over Hi-K dielectric layer 96 to form a gate electrode on the top and both sidewalls of fin 72. Similar to the bulk silicon, a thin metal layer may be formed between polysilicon 94 and Hi-K dielelctric layer 96. Alternatively, metal may be used to replace polysilicon 94.

In an alternative embodiment, isolation nitride 74 may stay in place throughout the process of FIGS. 9A-9C. Thus, isolation nitride 74 may stay on top of silicon fin 72, and Hi-K dielectric 96 wraps over both of them. The resulting structure may be viewed as a variation on a double-gate device in which gates formed on opposite sidewalls of fin 74 are isolated from each other. The variation may also apply to the process of FIGS. 6A-6C and to the process of FIGS. 11A-11E.

Figure 10:
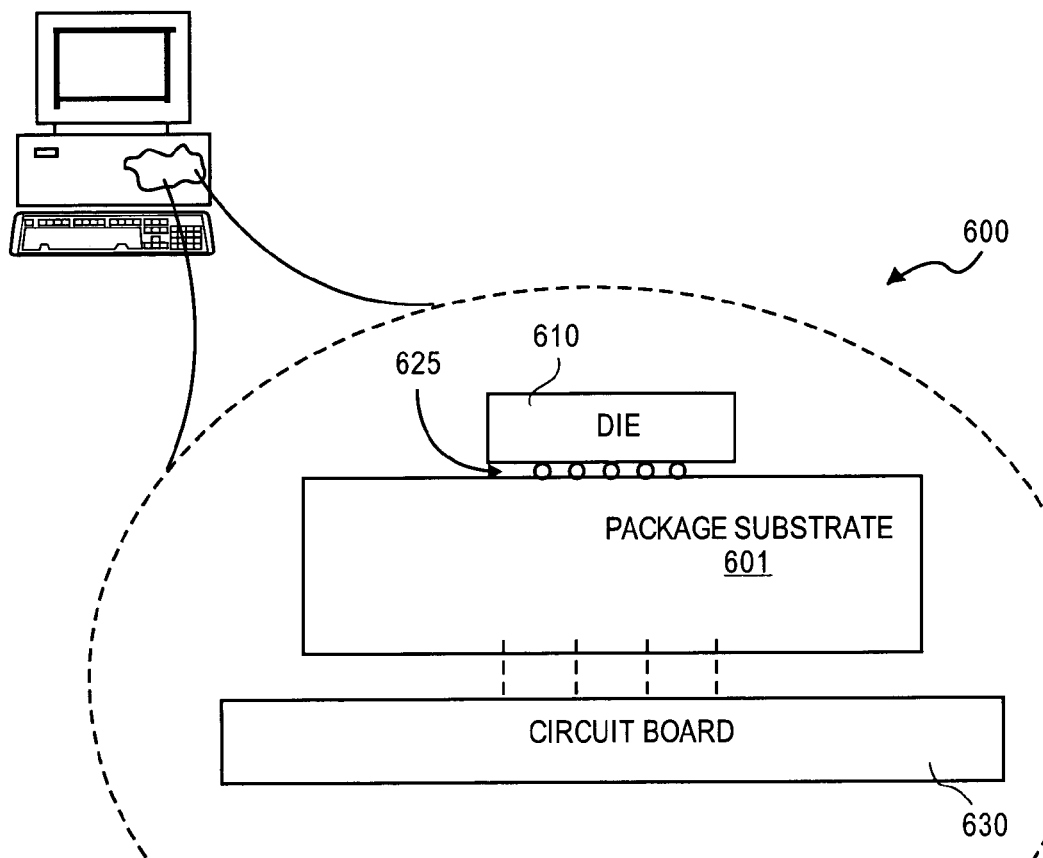
FIG. 10 is a cross-sectional view of an integrated circuit package comprising a MBT-FET.

FIG. 10 shows a cross-sectional side view of an integrated circuit package that can be physically and electrically connected to a printed wiring board or printed circuit board (PCB) to form an electronic assembly. The electronic assembly can be part of an electronic system such as a computer (e.g., desktop, laptop, hand-held, server, etc.), wireless communication device (e.g., cellular phone, cordless phone, pager, etc.), computer-related peripheral (e.g., printers, scanners, monitors, etc.), entertainment device (e.g., television, radio, stereo, tape and compact disc player, videocassette recorder, MP3 (Motion Picture Experts Group, Audio Layer 3) player, etc.), and the like. FIG. 10 illustrates the package as part of a desktop computer.

FIG. 10 shows an electronic assembly 600 including a die 610 physically and electrically connected to a package substrate 601. Die 610 includes an integrated circuit die, such as a processor die. In one embodiment, die 610 includes a MBT-FET having at least one neck section and at least one head section in the fin. Electrical contact points (e.g., contact pads on a surface of stacked die package 610) are connected to package substrate 601 through conductive bump layer 625. Package substrate 601 may be used to connect electronic assembly 600 to printed circuit board 630, such as a motherboard or other circuit board.

In the foregoing specification, specific embodiments have been described. It will, however, be evident that various modifications and changes can be made thereto without departing from the broader spirit and scope of the appended claims. The specification and drawings are, accordingly, to be regarded in an illustrative rather than a restrictive sense.

What is claimed is:

1. A method comprising:
   forming a transistor having a silicon body on a substrate;
   forming a blanket of an oxide layer covering the silicon body;
   removing a top layer of the oxide layer to expose a segment of the silicon body; and
   forming a narrow section at a bottom portion of the exposed segment, wherein the narrow section is located between a wide section and the substrate.

2. The method of claim 1 further comprising:
   surrounding three sides of the silicon body with a gate material.

3. The method of claim 1 wherein removing a bottom portion of the silicon body comprises:
   removing the bottom portion of the silicon body from opposite sides of the narrow section.

4. The method of claim 1 wherein removing a bottom portion of the silicon body comprises:
   dry etching the portion of the silicon body to be removed.

5. The method of claim 1 further comprising:
   removing a plurality portions of the silicon body from a plurality of sections of the silicon body, wherein each of the plurality sections is located at a different height of the silicon body.

6. An apparatus comprising:
   a substrate; and
   a transistor having a silicon body on the substrate, wherein the silicon body includes more than one pair of a wide section and a narrow section, each pair of the wide section and the narrow section located at a different height of the silicon body.

7. The apparatus of claim 6 wherein the silicon body is surrounded on three sides by a gate material.

8. The apparatus of claim 6 further comprising:
   a gate material covering the silicon body on two opposing sides; and
   an isolation layer overlying the silicon body.

9. The apparatus of claim 6 further comprising:
   polysilicon covering the silicon body; and
   a high-K dielectric layer between the polysilicon and the silicon body.

10. The apparatus of claim 9 further comprising:
    a thin metal layer between the polysilicon and the high-K dielectric layer.

11. The apparatus of claim 6 further comprising:
    a high-K dielectric layer covering the silicon body; and
    a metal layer covering the high-K dielectric layer.

12. A system comprising:
a computing device comprising a microprocessor comprising a plurality of circuit devices on a substrate, each of the plurality of circuit devices comprising:
a substrate; and
a transistor having a silicon body on the substrate, wherein the silicon body includes more than one pair of a wide section and a narrow section, each pair of the wide section and the narrow section located at a different height of the silicon body.

13. The system of claim 12 wherein the silicon body is surrounded on three sides by a gate material.

14. The system of claim 12 wherein the substrate comprises a bulk silicon.

15. The system of claim 12 wherein the substrate comprises a silicon-on-insulator substrate.

16. The system of claim 12 further comprising:
a gate material covering the silicon body on two opposing sides; and
an isolation layer overlying the silicon body.

17. The system of claim 12 further comprising:
polysilicon covering the silicon body; and
a high-K dielectric layer between the polysilicon and the silicon body.

18. The system of claim 17 further comprising:
a thin metal layer between the polysilicon and the high-K dielectric layer.

19. The system of claim 12 further comprising:
a high-K dielectric layer covering the silicon body; and
a metal layer covering the high-K dielectric layer.

* * * * *